United States Patent
Tan et al.

(10) Patent No.: US 9,748,908 B1
(45) Date of Patent: Aug. 29, 2017

(54) TRANSIMPEDANCE AMPLIFIER

(71) Applicant: LITE-ON SINGAPORE PTE. LTD., Singapore (SG)

(72) Inventors: Meng-Tong Tan, Singapore (SG); Huey-Jen Lim, Singapore (SG); You-Fa Wang, Sinapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/149,281

(22) Filed: May 9, 2016

(51) Int. Cl.
  *H03F 1/30* (2006.01)
  *H03F 3/08* (2006.01)
  *H03F 3/04* (2006.01)
  *H03F 1/34* (2006.01)

(52) U.S. Cl.
  CPC .............. *H03F 3/04* (2013.01); *H03F 1/34* (2013.01); *H03F 2200/153* (2013.01); *H03F 2200/408* (2013.01); *H03F 2200/411* (2013.01); *H03F 2200/555* (2013.01)

(58) Field of Classification Search
  CPC ....................................................... H03F 3/087
  USPC .................................................. 330/290, 308
  See application file for complete search history.

(56) References Cited

U.S. PATENT DOCUMENTS 6,720,826 B2 * 4/2004 Yoon ...................... H03F 3/087
                                                                250/214 A

* cited by examiner

*Primary Examiner* — Khanh V Nguyen
*Assistant Examiner* — Khiem Nguyen
(74) *Attorney, Agent, or Firm* — Li & Cai Intellectual Property (USA) Office

(57) ABSTRACT

Disclosed is a transimpedance amplifier, comprising a first-stage trans-conductance amplifier TCA, a second-stage TCA, a third-stage amplifier and a feedback circuit. The first-stage TCA is electrically connected to an input current source to receive a first input signal, and outputs a first output signal. The second-stage TCA is electrically connected to the first-stage TCA to receive the first output signal, and outputs a second output signal. The third-stage amplifier is electrically connected to the second-stage TCA to receive the second output signal, and outputs a third output signal. One end of the feedback circuit is electrically connected to the input of the first-stage TCA, and the other end of the feedback circuit is electrically connected to the output of the third-stage amplifier to stabilize the third output signal. The third-stage amplifier is composed of a first output stage and a second output stage.

5 Claims, 4 Drawing Sheets

TRANSIMPEDANCE AMPLIFIER

BACKGROUND OF THE INVENTION

1. Field of the Invention

The present invention relates to a trans-impedance amplifier (TIA), and in particular, to a trans-impedance amplifier for reducing propagation delay.

2. Description of Related Art

In optical communication systems, gain and sensitivity of optical receivers are important features, and both must be improved simultaneously in order to optimize transmission efficiency. Single-stage TIA used in conventional optical receivers have a simple structure, but suffers from the problem that high sensitivity cannot be achieved due to insufficient transimpedance gain, because there is a close relation between the overall gain and bandwidth characteristics and the impedance of an output of the amplifier.

Therefore, generally, the architecture of multi-stage trans-conductance amplifier (TCA) is used to design optical receivers in order to achieve high transimpedance gain. Such an architecture of multi-stage TCA usually comprises a plurality of single amplifiers in series, but because the input current of optical receivers depends on infrared light received by photodiodes, there may be a four times difference between the maximum and the minimum of the input current. This difference between the maximum and the minimum of the input current causes increased propagation delay from high to low in the potential of an output of the TIA.

SUMMARY OF THE INVENTION

An embodiment of the present invention is to provide a trans-impedance amplifier, comprising a first-stage TCA, a second-stage TCA, a third-stage amplifier and a feedback circuit. The first-stage TCA has an input and an output. The input of the first-stage TCA is electrically connected to an input current source to receive a first input signal, and the output of the first-stage TCA outputs a first output signal. The second-stage TCA has an input and an output. The input of the second-stage TCA is electrically connected to the output of the first-stage TCA to receive the first output signal, and the output of the second-stage TCA outputs a second output signal. The third-stage amplifier has an input and an output. The input of the third-stage amplifier is electrically connected to the output of the second-stage TCA to receive the second output signal, and the output of the third-stage amplifier outputs a third output signal. One end of the feedback circuit is electrically connected to the input of the first-stage TCA, and the other end of the feedback circuit is electrically connected to the output of the third-stage amplifier to stabilize the third output signal. The third-stage amplifier is composed of a first output stage and a second output stage.

In an embodiment of the present invention, the first output stage of the third-stage amplifier comprises a current source, having one end electrically connected to a supply voltage source to provide a stable current and the other end connected to the output of the third-stage amplifier.

In an embodiment of the present invention, the second output stage of the third-stage amplifier comprises a first NMOS transistor and a second PMOS transistor. The gates of the first NMOS transistor and the second PMOS transistor are connected to form the input of the third-stage amplifier. The source of the second PMOS transistor is electrically connected to the supply voltage source, and the drain of the second PMOS transistor and the drain of the first NMOS transistor are electrically connected to the output of the third-stage amplifier. The source of the first NMOS transistor is grounded.

In an embodiment of the present invention, the trans-impedance amplifier comprises a reference voltage circuit. The reference voltage circuit comprises a constant current unit, a third transistor, a fourth transistor, and a fifth transistor. The constant current unit comprises a current mirror and a bias current source. The gate of the third transistor, the gate of the fourth transistor and the current mirror are connected in parallel to each other. The drain of the fourth transistor forms an output of the reference voltage circuit to output a reference voltage signal. The fifth transistor is connected in parallel to the constant current unit and electrically connected between the supply voltage source and the output of the constant current unit.

To sum up, in the trans-impedance amplifier provided in the embodiments of the present invention, the third-stage amplifier composed of the first output stage and the second output stage is arranged wherein the first output stage has a circuit design in a Class-A configuration and the second output stage has a circuit design in a Class-AB configuration, such that the amplifier has the advantages of both Class-A amplifier and Class-AB amplifier, thereby reducing propagation delay of the trans-impedance amplifier. On the other hand, in the reference voltage circuit of the trans-impedance amplifier provided in the embodiments of the present invention, the fifth transistor is arranged in parallel to the constant current unit and electrically connected between the supply voltage source and the output of the constant current unit, so as to improve on the instability of the reference voltage signal due to temperature changes or fabrication process variation.

In order to further understand the features and technical content of the present invention, reference is made to the following detailed description and accompanying drawings of the present invention. However, the description and accompanying drawings are only intended to illustrate the present invention, but do not limit the scope of the present invention.

DETAILED DESCRIPTION OF THE PREFERRED EMBODIMENTS

Figure 1:
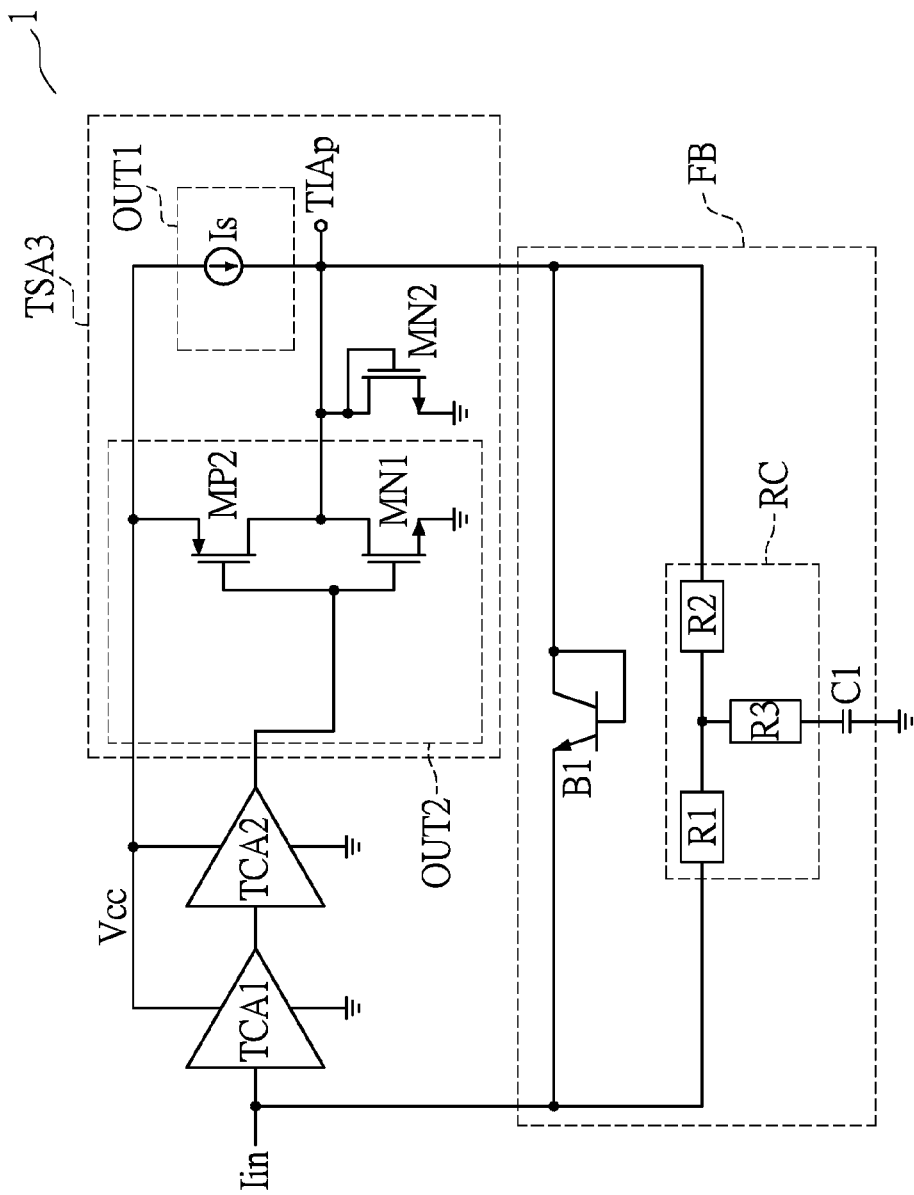
FIG. 1 is a circuit diagram of a trans-impedance amplifier according to an embodiment of the present invention.

Various exemplary embodiments will be described more fully with reference to the accompanying drawings, in which some exemplary embodiments are shown. However, the concept of the present invention may be embodied in many different forms and should not be construed as limited to the exemplary embodiments set forth herein. More specifically, the exemplary embodiments are provided so that this disclosure will be thorough and complete and will fully convey the scope of the invention to those skilled in the art. The size and relative sizes of layers and regions may be exaggerated for clarity in the drawings. Like numbers refer to like elements throughout.

It will be understood that although the terms first, second, third, and the like are used herein to describe various elements, these elements should not be limited by these terms. These terms are only used to distinguish one element from another element. Thus, a first element discussed below could be termed a second element without departing from the scope of the present invention. As used herein, the term "and/or" includes any and all combinations of one or more of the associated listed items.

[An Embodiment of Trans-Impedance Amplifier]

FIG. 1 is a circuit diagram of a trans-impedance amplifier according to an embodiment of the present invention. As shown in FIG. 1, a trans-impedance amplifier 1 comprises a first-stage TCA1, a second-stage TCA2, a third-stage amplifier TSA3 and a feedback circuit FB. The first-stage TCA1 has an input and an output. The input of the first-stage TCA TCA1 is electrically connected to an input current source Iin to receive a first input signal, and the output of the first-stage TCA1 outputs a first output signal. The second-stage TCA2 has an input and an output. The input of the second-stage TCA2 is electrically connected to the output of the first-stage TCA1 to receive the first output signal, and the output of the second-stage TCA2 outputs a second output signal. The third-stage amplifier TSA3 has an input and an output. The input of the third-stage amplifier TSA3 is electrically connected to the output of the second-stage TCA2 to receive the second output signal, and the output of the third-stage amplifier TSA3 outputs a third output signal TIAp. One end of the feedback circuit FB is electrically connected to the input of the first-stage TCA1, and the other end of the feedback circuit FB is electrically connected to the output of the third-stage amplifier TSA3 to stabilize the third output signal TIAp. The third-stage amplifier TSA3 comprises a first output stage OUT1 and a second output stage OUT2.

Next, the principle of operation of the trans-impedance amplifier 1 is further described. As shown in FIG. 1, the third-stage amplifier TSA3 in the trans-impedance amplifier 1 of the present invention is composed of the first output stage OUT1 and the second output stage OUT2. The first output stage OUT1 comprises a current source Is, wherein one end of the current source Is is electrically connected to a supply voltage source Vcc to provide a stable current, and the other end of the current source Is is connected to the output of the third-stage amplifier TSA3. The second output stage OUT2 comprises a first NMOS transistor MN1 and a second PMOS transistor MP2. The gates of the first NMOS transistor MN1 and the second PMOS transistor MP2 are connected to form the input of the third-stage amplifier TSA3. The source of the second PMOS transistor MP2 is electrically connected to the supply voltage source Vcc, and the drain of the second PMOS transistor MP2 and the drain of the first NMOS transistor MN1 are electrically connected to the output of the third-stage amplifier TSA3. The source of the first NMOS transistor MN1 is grounded. That is, the first output stage OUT1 is a Class-A output stage, and the second output stage OUT2 is a Class-AB output stage. In addition, in this embodiment, the third-stage amplifier TSA3 may further comprise a second NMOS transistor MN2, and as shown in FIG. 1, the gate and the drain of the second NMOS transistor MN2 are connected to the output of the third-stage amplifier TSA3.

In this embodiment, the first output stage OUT1 is the current source Is connected to a reference voltage source (not shown), which provides a stable current of which the current value is constant. After the input current source Iin begins to draw a current from the input, the current passing through the first NMOS transistor MN1 is decreased and also the current passing through the second PMOS transistor MP2 is increased, so that the voltage value of the third output signal TIAp is increased. The final voltage at the output of the TIA is controlled by the feedback resistors (R1 and R2) and the base-emitter voltage of the feedback BJT transistor B1.

It is noted that, in this embodiment, because the third-stage amplifier TSA3 has both Class-A output stage and Class-AB output stage, the advantages in design of both Class-A output stage and Class-AB output stage are provided. That is, the elements of the first output stage OUT1 are maintained to be in the on-state to provide better linearity, and also, the second output stage OUT2 can further improve the efficiency of the third-stage amplifier TSA3.

On the other hand, it should be noted in this embodiment that, both the first-stage TCA1 and the second-stage TCA2 are a Class-A output stage, and the first-stage TCA1, the second-stage TCA2 and the third-stage amplifier TSA3 are connected in series to each other in a manner of direct coupling. That is, no capacitor is arranged between the first-stage TCA1, the second-stage TCA2 and the third-stage amplifier TSA3, so in the circuit design, size ratios between the transistors should be particularly designed, such that the sensitivity of the overall trans-impedance amplifier to temperature changes and different manufacture processes can be improved.

Referring to FIG. 1 again, the feedback circuit FB in this embodiment comprises a bipolar junction transistor B1 and a resistor network RC. The emitter of the bipolar junction transistor B1 is electrically connected to the input current source Iin, and the base and the collector of the bipolar junction transistor B1 are connected to the output of the third-stage amplifier TSA3. In addition, the resistor network RC is connected in parallel to the bipolar junction transistor B1, and comprises a bridged T-network consisting of three resistors R1-R3 and a capacitor C1, where one end of the capacitor C1 is electrically connected to the bridged T network and the other end of the capacitor C1 is grounded. Furthermore, the feedback circuit FB can increase the AC gain of the trans-impedance amplifier 1 in this embodiment, where the bipolar junction transistor B1 in the feedback circuit FB is used to clamp the third output signal TIAp so as to stabilize the third output signal TIAp.

[Another Embodiment of Trans-Impedance Amplifier]

In order to illustrate in further detail the circuit design of the trans-impedance amplifier of the present invention, another embodiment is provided below for further description.

In the next embodiment, the portions different from the embodiment of FIG. 1 will be described and the remaining portions identical to the embodiment of FIG. 1 will be omitted. In addition, for ease of illustration, like reference numerals or symbols refer to like elements.

Figure 2:
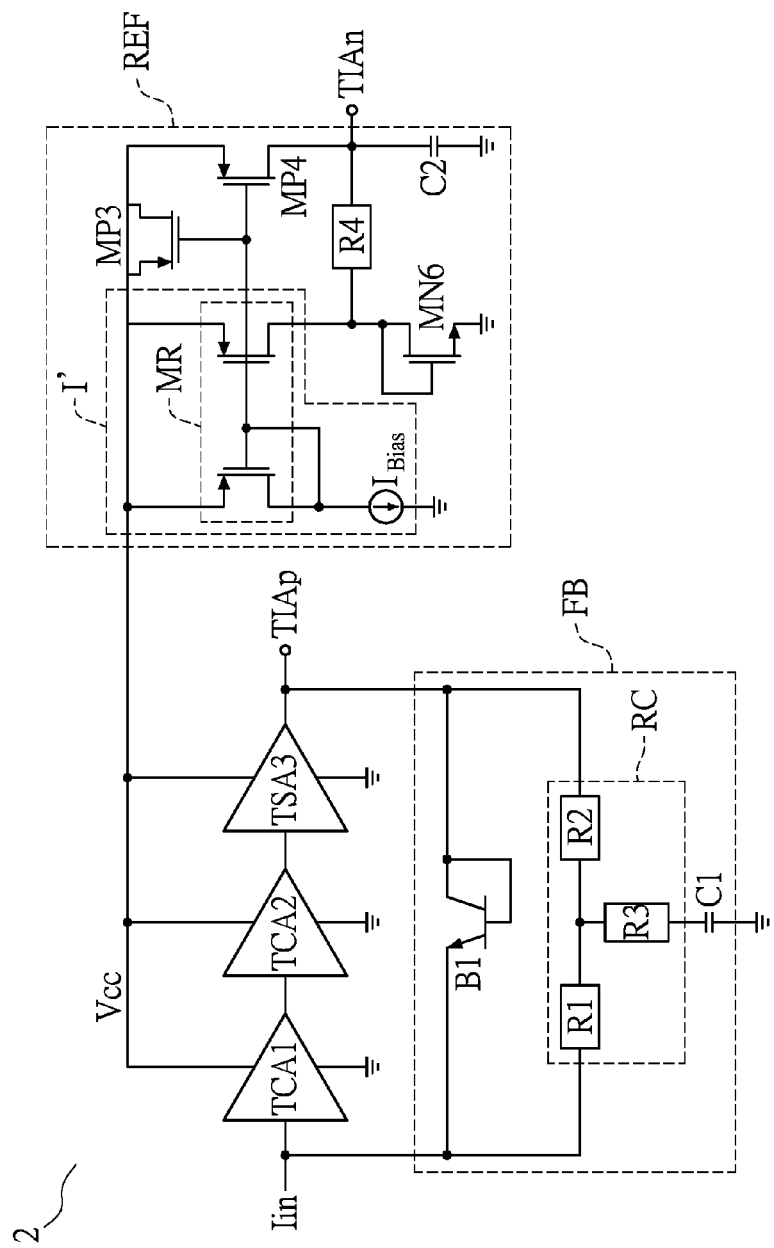
FIG. 2 is a circuit diagram of a trans-impedance amplifier according to another embodiment of the present invention.

FIG. 2 is a circuit diagram of a trans-impedance amplifier according to another embodiment of the present invention. The difference from the embodiment of FIG. 1 is that in this embodiment a trans-impedance amplifier 2 further comprises a reference voltage circuit, connected in parallel to the third-stage amplifier TSA3 and comprising a constant current unit I', a third transistor MP3, a fourth transistor MP4, a sixth transistor MN6, and a resistor R4. As shown in FIG.

2, the constant current unit I' comprises a current mirror MR and a bias current source $I_{Bias}$. The third transistor MP3, the fourth transistor MP4 and the current mirror MR are connected in parallel to each other, and the drain of the fourth transistor MP4 forms an output of a reference voltage circuit REF to output a reference voltage signal TIAn. One end of the resistor R4 is electrically connected to the drain and the gate of the sixth transistor MN6, and the other end of the resistor R4 is electrically connected to the output of the reference voltage circuit REF.

Similar to those shown in FIG. 1, in this embodiment, both the first-stage TCA1 and the second-stage TCA2 are a Class-A output stage, and the third-stage amplifier TSA3 has both Class-A output stage and Class-AB output stage, so the advantages in design of both Class-A output stage and Class-AB output stage are provided. That is, the elements of the first output stage OUT1 are maintained to be in the on-state to provide better linearity, and also, the second output stage OUT2 can further improve the power efficiency of the third-stage amplifier TSA3 Similarly, in this embodiment, the first-stage TCA1, the second-stage TCA2 and the third-stage amplifier TSA3 are connected in series to each other in a manner of direct coupling, and size ratios between the transistors are particularly designed, such that the sensitivity of the overall trans-impedance amplifier to temperature changes and different manufacture processes can be improved.

Furthermore, the circuit design of the feedback circuit FB in this embodiment is the same as that in the embodiment as shown in FIG. 1, and similarly, the feedback circuit FB can increase the AC gain of the trans-impedance amplifier 2 in this embodiment, where the bipolar junction transistor B1 in the feedback circuit FB has the effect of clamping the third output signal TIAp so as to stabilize the third output signal TIAp.

[Another Embodiment of Trans-Impedance Amplifier]

In order to illustrate in further detail the circuit design of the trans-impedance amplifier of the present invention, another embodiment is provided below for further description.

In the next embodiment, the portions different from the embodiment of FIG. 2 will be described and the remaining portions identical to the embodiment of FIG. 2 will be omitted. In addition, for ease of illustration, like reference numerals or symbols refer to like elements.

Figure 3:
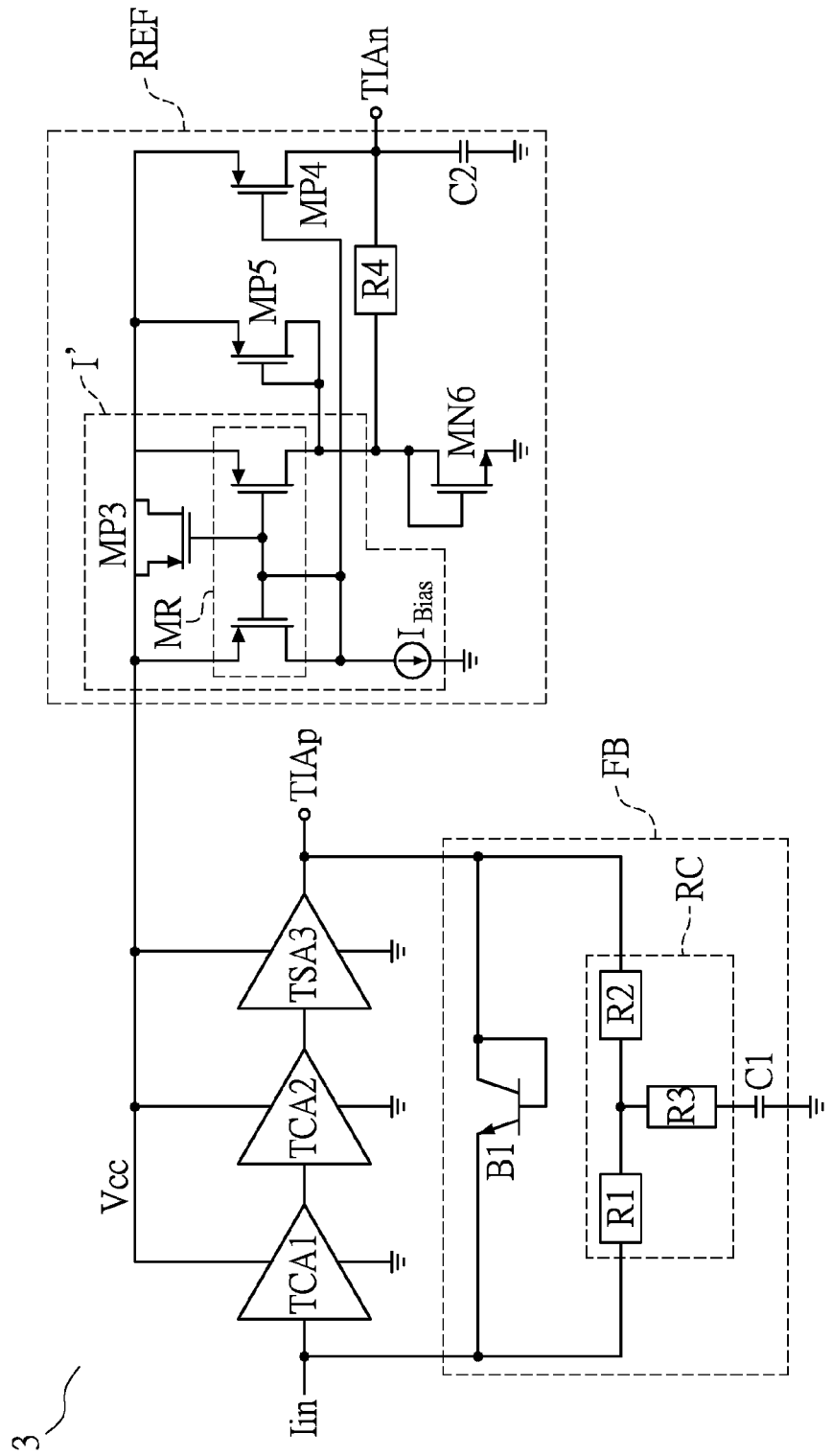
FIG. 3 is a circuit diagram of a trans-impedance amplifier according to another embodiment of the present invention.

FIG. 3 is a circuit diagram of a trans-impedance amplifier according to another embodiment of the present invention. The difference from the embodiment of FIG. 2 is that in a trans-impedance amplifier 3 in this embodiment, the reference voltage circuit REF further comprises a fifth transistor MP5. The fifth transistor MP5 is connected in parallel to the constant current unit I' and electrically connected between the supply voltage source Vcc and the output of the constant current unit I'.

Figure 4A:
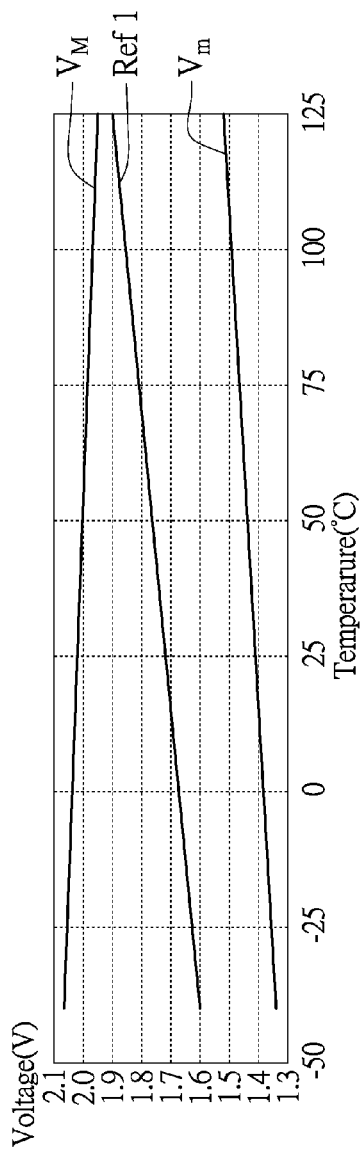
FIG. 4A is a graph of a reference voltage signal in the trans-impedance amplifier according to the embodiment as shown in FIG. 2 as a function of temperature.
Figure 4B:
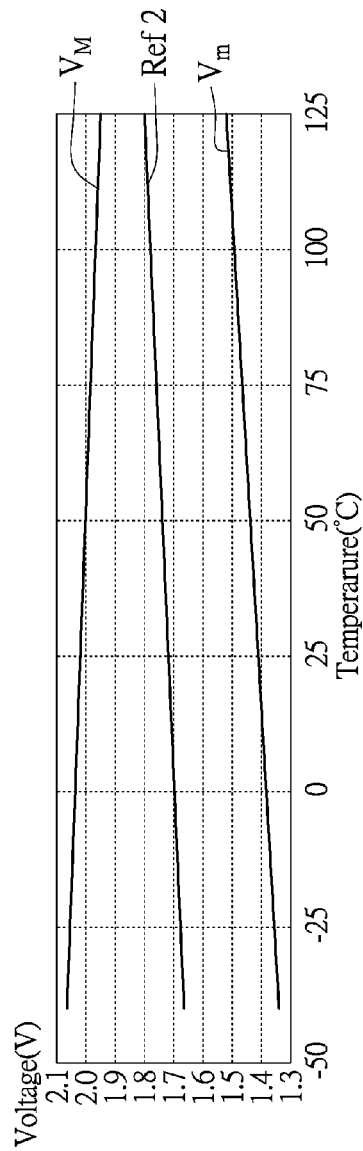
FIG. 4B is a graph of a reference voltage signal in the trans-impedance amplifier according to the embodiment as shown in FIG. 3 as a function of temperature.

Next, referring to FIG. 4A and FIG. 4B, FIG. 4A is a graph of the reference voltage signal in the trans-impedance amplifier according to the embodiment as shown in FIG. 2 as a function of temperature, and FIG. 4B is a graph of the reference voltage signal in the trans-impedance amplifier according to the embodiment as shown in FIG. 3 as a function of temperature.

It is assumed that the temperature change is from −40° C. to 125° C., as shown in FIG. 4A, the graph $V_m$ shows the changes of the third output signal TIAp of the trans-impedance amplifier 3 at a low potential as a function of temperature, the graph $V_M$ shows the changes of the third output signal TIAp of the trans-impedance amplifier 3 at a high potential as a function of temperature, and Ref1 shows the changes of the reference voltage signal as a function of temperature. On the other hand, as shown in FIG. 4B, the graph $V_m$ shows the changes of the third output signal TIAp of the trans-impedance amplifier 3 at a low potential as a function of temperature, the graph $V_M$ shows the changes of the third output signal TIAp of the trans-impedance amplifier 3 at a high potential as a function of temperature, and Ref2 shows the changes of the reference voltage signal as a function of temperature.

It can be known from the comparison of FIG. 4A and FIG. 4B that, the voltage change rate of the reference voltage signal of the reference voltage circuit REF in the embodiment of FIG. 3 is close to or equal to that of the third output signal TIAp, but this is not the case in the embodiment of FIG. 2.

Furthermore, compared to the reference voltage circuit REF in the embodiment of FIG. 2, the reference voltage circuit REF in the embodiment of FIG. 3 is additionally provided with the fifth transistor MP5, and the fifth transistor MP5 is connected in parallel to the constant current unit I' and electrically connected between the supply voltage source Vcc and the output of the constant current unit I', such that by compensating the voltage changes due to temperature variation, the voltage change rate of the reference voltage signal can be made close to or equal to that of the third output signal, thereby achieving the effect of stabilizing the reference voltage signal.

It should also be noted that, similar to those shown in FIG. 1 and FIG. 2, in this embodiment, both the first-stage TCA1 and the second-stage TCA2 also are a Class-A output stage, and the third-stage amplifier TSA3 also has both Class-A output stage and Class-AB output stage, so the advantages in design of both Class-A output stage and Class-AB output stage are provided. That is, the elements of the first output stage OUT1 are maintained to be in the on-state to provide better linearity, and also, the second output stage OUT2 can further improve the power efficiency of the third-stage amplifier TSA3. Similarly, in this embodiment, the first-stage TCA1, the second-stage TCA2 and the third-stage amplifier TSA3 are connected in series to each other in a manner of direct coupling, and size ratios between the transistors are particularly designed, such that the sensitivity of the overall trans-impedance amplifier to temperature changes and different manufacture processes can be improved.

Furthermore, the circuit design of the feedback circuit FB in this embodiment is the same as that in the embodiments as shown in FIG. 1 and FIG. 2, and similarly, the feedback circuit FB can increase the AC gain of the trans-impedance amplifier 3 in this embodiment, where the bipolar junction transistor B1 in the feedback circuit FB has the effect of clamping the third output signal TIAp so as to stabilize the third output signal TIAp.

Possible Effects of the Embodiments

To sum up, in the trans-impedance amplifier provided in the embodiments of the present invention, the third-stage amplifier TSA3 composed of the first output stage and the second output stage is arranged where the first output stage has a circuit design in Class-A output stage and the second output stage has a circuit design in Class-AB output stage, such that the trans-impedance amplifier has the advantages of both a Class-A amplifier and a Class-AB amplifier, thereby reducing propagation delay of the trans-impedance amplifier. On the other hand, in the reference voltage circuit of the trans-impedance amplifier provided in the embodiments of the present invention, the fifth transistor is arranged in parallel to the constant current unit and electrically connected between the supply voltage source and the output of the constant current unit I', so as to improve on the instability of the reference voltage signal due to temperature changes or different manufacture manners.

The above description only provides embodiments of the present invention, but is not intended to limit the scope of the present invention.

What is claimed is:

1. A trans-impedance amplifier, comprising:
   a first-stage TCA having an input and an output, wherein the input of the first-stage TCA is electrically connected to an input current source to receive a first input signal, and the output of the first-stage TCA outputs a first output signal;
   a second-stage TCA having an input and an output wherein the input of the second-stage TCA is electrically connected to the output of the first-stage TCA to receive the first output signal, and the output of the second-stage TCA outputs a second output signal;
   a third-stage amplifier having an input and an output wherein input of the third-stage amplifier is electrically connected to the output of the second-stage TCA to receive the second output signal, and the output of the third-stage amplifier outputs a third output signal;
   a feedback circuit, wherein one end of the feedback circuit is electrically connected to the input of the first-stage TCA, and the other end of the feedback circuit is electrically connected to the output of the third-stage amplifier to stabilize the third output signal;
   wherein the third-stage amplifier comprises:
      a first output stage, comprising a current source, wherein the current source is electrically connected to a supply voltage source and the output of the third-stage amplifier; and
      a second output stage, comprising a first NMOS transistor and a second PMOS transistor, wherein the gates of the first NMOS transistor and the second PMOS transistor are connected to form the input of the third-stage amplifier, the source of the second PMOS transistor is electrically connected to the supply voltage source, the drain of the second PMOS transistor and the drain of the first NMOS transistor are electrically connected to the output of the third-stage amplifier, and the source of the first NMOS transistor is grounded;
   wherein the third-stage amplifier comprises:
      a bipolar junction transistor, wherein the emitter of the bipolar junction transistor is electrically connected to the input current source, and the base and the collector of the bipolar junction transistor are connected to the output of the third-stage amplifier; and
      a resistor network, connected in parallel to the bipolar junction transistor.

2. The trans-impedance amplifier of claim 1, wherein the resistor network comprises a bridged T network and a capacitor, wherein the bridged T network comprises three resistors, one end of the capacitor is electrically connected to the bridged T network and the other end of the capacitor is grounded.

3. The trans-impedance amplifier of claim 1, wherein the first-stage TCA, the second-stage TCA and the third-stage amplifier are connected in series to each other in a manner of direct coupling.

4. The trans-impedance amplifier of claim 1, further comprising a reference voltage circuit, connected in parallel to the third-stage amplifier and comprising a constant current unit, a third transistor, a fourth transistor, a fifth transistor, a sixth transistor and a resistor;
   wherein the constant current unit comprises a current mirror and a bias current source, the fifth transistor is connected in parallel to the constant current unit and electrically connected between the supply voltage source and the output of the reference voltage circuit, one end of the resistor is electrically connected to the source and the gate of the sixth transistor, and the other end of the resistor is electrically connected to the output of the reference voltage circuit, the third transistor, the fourth transistor and the current mirror are connected in parallel to each other, and the drain of the fourth transistor forms an output of the reference voltage circuit to output a reference voltage signal.

5. The trans-impedance amplifier of claim 4, wherein the voltage change rate of the reference voltage signal is close to or equal to that of the third output signal.

* * * * *